United States Patent [19]

Demmer et al.

[11] Patent Number: 4,681,923
[45] Date of Patent: Jul. 21, 1987

[54] MODIFIED QUINONE-DIAZIDE GROUP-CONTAINING PHENOLIC NOVOLAK RESINS

[75] Inventors: Christopher G. Demmer, Cambridge; Edward Irving, Burwell, both of England

[73] Assignee: Ciba-Geigy Corporation, Ardsley, N.Y.

[21] Appl. No.: 831,685

[22] Filed: Feb. 21, 1986

[30] Foreign Application Priority Data

Mar. 2, 1985 [GB] United Kingdom ............... 8505402

[51] Int. Cl.$^4$ .................... C08G 8/32; C08L 61/14
[52] U.S. Cl. ................... 525/504; 204/181.6; 430/190; 430/191; 430/192; 430/314; 430/323; 525/505; 525/508; 522/35; 522/39; 522/166; 522/904
[58] Field of Search ............... 430/192, 314, 323, 190, 430/191; 525/504, 505, 508; 204/181.6; 522/35, 39, 166, 904

[56] References Cited

U.S. PATENT DOCUMENTS

| | | | |
|---|---|---|---|
| 3,046,118 | 7/1962 | Schmidt | 430/193 |
| 3,046,120 | 7/1962 | Schmidt et al. | 430/190 |
| 4,115,128 | 9/1978 | Kita | 430/191 |
| 4,266,001 | 5/1981 | Buhr et al. | 430/192 |
| 4,306,010 | 12/1981 | Uehara et al. | 430/190 |
| 4,308,368 | 12/1981 | Kubo et al. | 525/504 |
| 4,377,631 | 3/1983 | Toukhy et al. | 430/191 X |
| 4,439,511 | 3/1984 | Stahlhofen | 430/192 X |
| 4,442,195 | 4/1984 | Yamamoto et al. | 430/192 X |
| 4,477,553 | 10/1984 | Yamamoto et al. | 430/190 X |
| 4,529,682 | 7/1985 | Toukhy | 430/192 X |
| 4,536,465 | 8/1985 | Uehara et al. | 430/190 X |
| 4,564,575 | 1/1986 | Perreault et al. | 430/192 X |
| 4,578,438 | 3/1986 | Demmer et al. | 525/504 X |

FOREIGN PATENT DOCUMENTS

| | | |
|---|---|---|
| 83971 | 7/1983 | European Pat. Off. |
| 1227602 | 4/1971 | United Kingdom |
| 1329888 | 9/1973 | United Kingdom |
| 1330932 | 9/1973 | United Kingdom |

Primary Examiner—Howard E. Schain
Attorney, Agent, or Firm—Luther A. R. Hall

[57] ABSTRACT

An electrodepositable photosensitive modified phenolic novolak resin of general formula

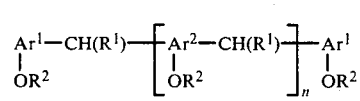

where
- $Ar^1$ represents a divalent aromatic group linked through aromatic carbon atoms to the indicated groups —$OR^2$ and —$CH(R^1)$—,
- $Ar^2$ represents a trivalent aromatic group linked through aromatic carbon atoms to the indicated groups —$OR^2$ and —$CH(R^1)$—,
- $R^1$ represents a hydrogen atom or an alkyl, aryl or carboxyl group,
- $R^2$ represents a hydrogen atom, an alkyl group which may be substituted by a hydroxyl or alkoxy group, or a group of formula —$CO$—$R^3$—$COOH$, —$SO_2R^4$, —$COR^5$ or —$SO_2R^5$, at least 1% of the groups $R^2$ representing a group —$CO$—$R^3$—$COOH$ and at least 4% of the groups $R^2$ representing a group —$SO_2R^4$,
- $R^3$ denotes a divalent aliphatic, cycloaliphatic, aromatic or araliphatic group,
- $R^4$ denotes a 1,2-benzoquinone diazide group or 1,2-naphthoquinone diazide group
- $R^5$ denotes a carboxyl-free monovalent group, and
- n denotes zero or an integer of 1 to 20.

The resins are useful in printed circuit manufacture.

20 Claims, No Drawings

MODIFIED QUINONE-DIAZIDE GROUP-CONTAINING PHENOLIC NOVOLAK RESINS

This invention relates to new modified phenolic resin products and to processes for their preparation, these new products being both photosensitive and electrodepositable.

Photosensitive phenolic novolak resins are well known and are used mainly in the preparation of presensitised lithographic plates. They are usually prepared by condensation of a phenolic resin with a quinone diazide sulphonyl chloride, giving a product having photosensitivity due to the presence of the quinone diazide groups, and good adhesion and toughness, due to the presence of the novolak resin 'backbone'. Plates coated with these materials withstand the mechanical wear of the lithographic printing process.

In British Patent Specification No. 1 277 602, for example, there is described a presensitised lithographic plate having a layer of water-insoluble condensation product that is an ester of a benzo- or naphthoquinone diazide sulphonic acid with a resin containing phenolic hydroxyl groups, a cresol-formaldehyde resin being exemplified. In British Patent Specification No. 1 329 888 there is described a condensation product of a para-substituted phenolic resin, having an alkyl, aryl, alkoxy, sulphoalkyl, aryloxy aralkyloxy, carboalkoxy, aralkyl or acetyl group para to the phenolic hydroxyl group, with a sulphonyl chloride of o-benzoquinone diazide or o-naphthoquinone diazide. These condensation products are said to be especially useful in the preparation of presensitised plates for photomechanical processes. British Patent Specification No. 1 330 932 describes condensation products of benzo- or naphthoquinonediazide sulphonyl chlorides with novolaks made from a bisphenol and formaldehyde. These products are said to be useful in the preparation of presensitised plates for lithographic processes. Finally U.S. Pat. No. 4 306 010 describes condensation products of o-benzo- or o-naphtho-quinonediazide sulphonyl chlorides with a resin prepared from a polyhydric phenol, such as resorcinol-benzaldehyde resin or a resorcinol-4-methylbenzaldehyde resin. These products are said to be suitable for the preparation of photosensitive plates for use in lithography. Positive photoresists based on mixtures of conventional quinone diazide-modified phenolic resins and acid anhydrides have been described, but such mixtures do not give satisfactory films on electrodeposition.

The electrodeposition of positive-working photoresists has the advantage that very uniform coverage is obtainable, which is particularly important on edges and in plated through-holes, using relatively thin films of the photoresist. The use of thin, uniform films offers the potential of improved resolution compared with conventional film and liquid photoresists. A further advantage is that there is a reduced need for large 'rest rings', or 'islands' to support photopolymer films above plated through-holes, and hence a greater area of the circuit board is available for conductor tracks. Also, electrodepositable photoresists can be formulated with a minimal organic solvent content and may be deposited at a very high solids content, giving important safety and environmental benefits. Finally, resist utilisation is very high and complete automation of the coating process is possible.

It has now been found that certain quinone diazide group-containing novolak resins may be electrodeposited to give coatings that are suitable for use in the manufacture of printed circuits, having the advantages listed above. The ability to electrodeposit such resins is dependent upon their being present, at least partially, in the form of salts. The preparation of new resins having a photosensitive quinone diazide group and a carboxyl group, enables the required electrodepositability to be obtained with no loss of photosensitivity.

Accordingly, this invention provides an electrodepositable photosensitive modified phenolic novolak resin of general formula

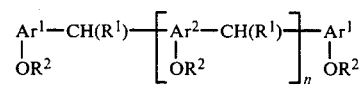

where

Ar$^1$ represents a divalent aromatic group linked through aromatic carbon atoms to the indicated groups —OR$^2$ and —CH(R$^1$)—, Ar$^2$ represents a trivalent aromatic group linked through aromatic carbon atoms to the indicated groups —OR$^2$ and —CH(R$^1$)—, R$^1$ represents a hydrogen atom or an alkyl, aryl or carboxyl group, R$^2$ represents a hydrogen atom, an alkyl group which may be substituted by a hydroxyl or alkoxy group, or a group of formula —CO—R$^3$—COOH, —SO$_2$R$^4$, —COR$^5$ or —SO$_2$R$^5$, at least 1% of the groups R$^2$ representing a group —CO—R$^3$—COOH and at least 4% of the groups R$^2$ representing a group —SO$_2$R$^4$, R$^3$ denotes a divalent aliphatic, cycloaliphatic, aromatic or araliphatic group, R$^4$ denotes a 1,2-benzoquinone diazide group or 1,2-naphthoquinone diazide group of formula

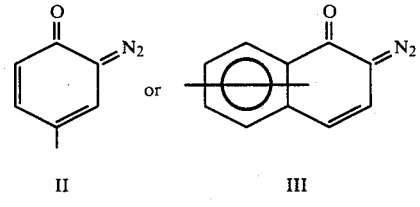

the free valency bond of formula III being in the 4- or 5-position,

R$^5$ represents a carboxyl-free monovalent aliphatic, cycloaliphatic, aromatic or araliphatic group, and n denotes zero or an integer of 1 to 20, preferably 1 to 10.

The aromatic groups Ar$^1$ and Ar$^2$ conveniently have from 6 to 25, preferably from 6 to 15, carbon atoms and may have a substituent R$^6$ on an aromatic carbon atom, where R$^6$ represents a halogen atom, a group of formula —OR$^2$, or an optionally esterified carboxyl or sulphonic acid group; an alkyl, alkenyl or aryl group which may be substituted by a hydroxyl or carboxyl group; a group of formula —COR$^7$ where R$^7$ represents an alkyl, cycloalkyl or aryl group; or one group on each aromatic ring may represent a group of formula

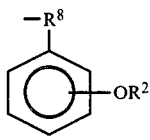

IV which may be connected to adjacent aromatic rings through group —CH($R^1$)—, where $R^8$ represents an oxygen or sulphur atom, a carbonyl or sulphonyl group, or an alkylene group of 1 to 8 carbon atoms optionally substituted by a halogen atom, a hydroxyl group (which may be etherified), a carboxyl group (which may be esterified) or an aryl group of 6 to 12 carbon atoms (which may be substituted by a halogen atom or an optionally etherified hydroxyl group or an optionally esterified carboxyl group), or when there are two substituents $R^6$ on adjacent carbon atoms, the two substituents $R^6$, together with the carbon atoms to which they are attached, represent a benzo group, which may be substituted or unsubstituted.

Preferred resins are those of general formula

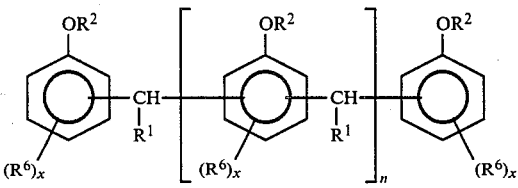

V where $R^1$, $R^2$, $R^6$ and n are as hereinbefore defined, and x denotes zero, 1, 2 or 3.

Preferably, 8% to 75%, especially 10% to 50% and particularly 10 to 25%, of the groups $R^2$ represent a quinone diazide sulphonyl group of formula —$SO_2R^4$. Preferably also, 2% to 50%, especially 4% to 30%, and particularly 4 to 20%, of the groups $R^2$ represent a group of formula —CO—$R^3$—COOH. Any remaining groups $R^2$ may denote a hydrogen atom, an alkyl group, optionally substituted by a hydroxyl or alkoxy group, or a group of formula —$COR^5$ or —$SO_2R^5$. It is preferred that 25% to 88%, especially 50% to 85%, and particularly 60 to 85%, of the groups $R^2$ represent a hydrogen atom. In preferred resins, some of the groups $R^2$ represent —$SO_2R^4$, some represent —CO—$R^3$—COOH and substantially all of the remainder represent hydrogen, the preferred and especially preferred percentages being as defined above.

It is preferred that
 alkyl, alkoxy and alkenyl groups within the definitions or $R^1$, $R^2$, $R^6$ and $R^7$ have up to 20, especially up to 10, carbon atoms,
 aryl and aralkyl groups within the definitions of $R^1$, $R^6$ and $R^7$ have up to 20, especially up to 10, carbon atoms, and
 monovalent groups within the definition of $R^5$ and divalent groups within the definition of $R^3$ have up to 25, especially up to 20, carbon atoms.

$R^1$ preferably represents a hydrogen atom, a methyl, ethyl or phenyl group or a carboxyl group. Resins in which $R^1$ represents a hydrogen atom or a phenyl group are particularly preferred.

Where $R^2$ represents an optionally substituted alkyl group, it is further preferred that the alkyl group contains 1 to 4 carbon atoms and is optionally substituted by a hydroxyl group or an alkoxy group of 1 to 4 carbon atoms, particularly preferred groups being methyl, ethyl, isopropyl, n-butyl, 2-hydroxyethyl, 2-hydroxypropyl, 2-methoxyethyl and 2-butoxyethyl groups.

Suitable divalent groups $R^3$ include aliphatic, cycloaliphatic and aromatic hydrocarbyl groups which may be substituted by one or more halogen atoms, alkoxy groups having 1 to 4 carbon atoms or carboxyl groups (which may be esterified). Such groups $R^3$ are suitably the residues of aliphatic, cycloaliphatic and aromatic polycarboxylic acid, having from 4 to 20 carbon atoms, after the removal of two carboxyl groups. Examples of suitable aliphatic groups $R^3$ are the residues of saturated and unsaturated aliphatic dicarboyxlic acids having from 4 to 18 carbon atoms, and having the two carboxyl groups separated by a chain of 2 or 3 carbon atoms, such as succinic, glutaric, methylsuccinic, iso-octenylsuccinic (6-methyl-1-heptenylsuccinic), nonenylsuccinic, dodecenylsuccinic, itaconic, maleic, dichloromaleic and citraconic acids.

Suitable cycloaliphatic groups $R^3$ are, for example, the residues of cycloaliphatic dicarboxylic acids having from 5 to 20, preferably from 5 to 12, carbon atoms, such as cyclopropane-, cyclobutane-, cyclopentane-, cyclohexane-, cyclopropene-, cyclobutene, cyclopentene-, cyclohexene- and endomethylenecyclohexene dicarboxylic acids, preferred such acids being hexahydrophthalic, tetrahydrophthalic and methyltetrahydrophthalic acids, bicyclo[2.2.1]hept-5-ene-2,3-dicarboxylic acid and the 1,4,5,6,7,7-hexachloro derivative thereof.

Examples of suitable aromatic groups $R^3$ are the residues of aromatic polycarboxylic acids having from 8 to 18 carbon atoms, such as phthalic, tetrachlorophthalic, tetrabromophthalic and trimellitic acids.

Particularly preferred groups $R^3$ are the residues of glutaric, iso-octenylsuccinic and phthalic acids after removal of two carboxyl groups, that is, trimethylene, iso-octenylethylene and 1,2-phenylene groups respectively.

$R^4$ is preferably a 1,2-naphthoquinone diazide group of formula III.

Preferred groups $R^5$ include alkyl groups, particularly of 1 to 10 carbon atoms, which may be halogen- or hydroxyl-substituted, and aryl groups, particularly of 6 to 10 carbon atoms, which may of halogen- or hydroxyl-substituted. Especially preferred groups $R^5$ are methyl, phenyl and p-tolyl.

Preferred atoms and groups $R^6$ include chlorine and bromine atoms, hydroxyl groups, alkoxy groups of 1 to 4 carbon atoms, alkyl groups of 1 to 9 carbon atoms, carboxyl groups, esterified carboxyl groups having 2 to 12 carbon atoms, sulphonic acids groups, esterified sulphonic acid groups of 1 to 10 carbon atoms, groups of formula —$OR^2$, groups of formula —$COR^7$ where $R^7$ represents an alkyl group of 1 to 4 carbon atoms or an aryl group of 6 to 10 carbon atoms, groups of formula IV where $R^8$ represents a methylene or isopropylidene group or a group of formula —CH(COOH)— or —C($CH_3$)[($CH_2$)$_2$COOH]—, and, where there are two groups $R^6$ on adjacent carbon atoms, benzo groups formed by the groups $R^6$ and the carbon atoms to which they are attached, these carbon atoms preferably being in the 2,3 positions with respect to the indicated groups —$OR^2$. In especially preferred resins of formula V, either x denotes zero, so that $R^6$ is absent, or x denotes 1 and the groups $R^6$ represent the same or different alkyl group having 1 to 9 carbon atoms or a group of formula IV where $R^8$ represents a methylene or isopropylidene group. In a further alternative, x denotes zero for part of the indicated aromatic rings in formula V and denotes 1 for the remainder of the rings, the groups $R^6$ representing the same or different alkyl group having 1 to 9 carbon atoms. Specific preferred alkyl groups $R^6$ are o-, m-, and p-methyl, o-, m- and p-tert.butyl and o-, m- and p-octyl, the positions being relative to the groups —$OR^2$. Further especially preferred resins of formula V are those where x denotes 1 for part of the indicated aromatic rings, the groups $R^6$ representing the same or different alkyl group of 1 to 9 carbon atoms, and x denotes 2 for the remaining aromatic rings, the two groups $R^6$ being in the 2,3-positions with respect to the indicated groups —$OR^2$ and the groups $R^6$, together with the carbon atoms to which they are attached, representing an unsubstituted benzo group.

The invention also provides a process for the preparation of photosensitive modified phenolic novolak resins which comprises reacting (A) a phenolic novolak resin, prepared from a phenol (B) and an aldehyde (C), with (D) a quinone diazide sulphonic acid or reactive derivative thereof, at least one of (A), (B) and the reaction product of (A) and (D) being further reacted with (E) a polycarboxylic acid anhydride of formula

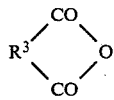  VI where $R^3$ is as hereinbefore defined.

The process is preferably effected by reacting the novolak resin (A) with the quinone diazide sulphonic acid or its derivative (D) and then reacting the resulting product with the anhydride (E), or by reacting (A) with (E) and reacting the resulting product with (D).

The quinone diazide sulphonic acid or its derivative (D) is generally used in an amount of at least 0.04 mole, preferably from 0.04 to 0.75 mole, especially from 0.10 to 0.50 mole, and particularly from 0.10 to 0.25 mole, per equivalent of phenolic hydroxyl group in the novolak resin (A) or the phenol (B). The anhydride (E) is generally used in an amount of at least 0.01 mole, preferably from 0.02 to 0.5 mole, especially from 0.04 to 0.3 mole, particularly from 0.04 to 0.2 mole, per equivalent of phenolic hydroxyl group in the novolak resin (A) or the phenol (B).

Any remaining phenolic hydroxl groups are preferably left free. However, they may, if desired, be esterified by (F) an esterifying agent other than (D) or etherified by an etherifying agent (G). This esterification or etherification may be effected by reacting at least one of the novolak resin (A), the reaction product of (A) with (D), the reaction product of (A) with E, and the reaction product of (A), (D) and (E) with (F) or (G).

The novolak resin (A) may be from a single phenol (B) or from a mixture of phenols (B), any of which may be monohydric or polyhydric and have one or more aromatic rings.

Preferred phenols (B) have the general formula

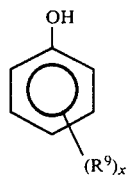  VII where x denotes zero, 1, 2 or 3, and $R^9$ has the same meaning as $R^6$ in formula I or V, with the proviso that it may not represent a group of formula IV but instead may represent a group of formula

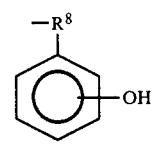  VIII where $R^8$, and preferred atoms or groups $R^8$, are as defined above.

Preferred values for x are as defined above and preferred atoms or groups $R^9$ are the same as the preferred atoms or groups $R^6$ as defined above. Thus suitable phenols (B) include o-, m- and p-chlorophenol, resorcinol, bis(4-hydroxyphenyl)methane, 4,4'-dihydroxybenzophenone, 2,2-bis(4-hydroxyphenyl)acetic acid, 4,4-bis(4-hydroxphenyl)pentanoic acid, p-hydroxybenzoic acid, 2-naphthol, 4-chloro-1-naphthol, 4-methyl-2-naphthol, 1,5- and 1,7-dihydroxynaphthalenes and mixtures of two or more of these phenols. Preferred phenols (B) are phenol itself, o-, m- and p-cresol, o-, m- and p-tert.butylphenol, o-, m- and p-octylphenol, 1-naphthol, 2,2-bis(4-hydroxyphenyl)propane and mixtures of two or more of these phenols. In especially preferred embodiments, (B) is m-cresol, a mixture of phenol and p-tert.butylphenol, a mixture of o-, m- and p-cresols, a mixture of 1-naphthol and m-cresol, or 2,2-bis(4-hydroxyphenyl)propane.

The aldehyde (C) from which the novolak (A) is prepared is preferably of formula $R^1CHO$  IX where $R^1$ and preferred atoms and groups $R^1$ are as defined above. Thus, preferred aldehydes include formaldehyde, acetaldehyde, propionaldehyde, benzaldehyde, and glyoxylic acid, whilst formaldehyde and benzaldehyde are particularly preferred.

Reaction between the phenol (B) and the aldehyde (C) to form the novolak resin may be effected following conventional practice for the preparation of novolaks, the phenol being heated with one molar equivalent, or less, of the aldehyde in the presence of an acid.

The quinone diazide derivative (D) is preferably of formula $R^4SO_2Z$  X where $R^4$ and preferred groups $R^4$ are as defined above, and Z represents a hydroxyl group, an alkoxy group, preferably of 1 to 4 carbon atoms, or a halogen atom, especially a chlorine atom.

Preferably (D) is 1,2-naphthoquinone-2-diazide-4- or 5-sulphonyl chloride or 1,2-benzoquinone-2-diazide-4-sulphonyl chloride. Reaction between (D) and the phenolic novolak (A), or between (D) and the reaction product of the phenolic novolak (A) and the anhydride (E), is usually effected in an inert solvent, such as a ketone or ether, at ambient temperature and in the presence of a suitable condensing agent, which may be an acid when Z represents a hydroxyl or alkoxy group, or a base when Z represents a halogen atom.

Preferred and particularly preferred anhydrides of formula VI are those of the acids mentioned above as the source of the divalent group $R^3$. Thus particularly preferred anhydrides are glutaric, iso-octenylsuccinic and phthalic anhydrides.

The optional esterifying agent (F) is usually a carboxylic or sulphonic acid or its derivative, of formula $R^5COZ$ or $R^5SO_2Z$ where $R^5$ and Z, and preferred atoms or groups $R^5$ and Z, are as hereinbefore defined. Preferred such esterifying agents include acetyl chloride, benzoyl chloride, methanesulphonyl chloride, benzenesulphonyl chloride, and p-toluenesulphonyl chloride.

The optional etherifying agent (G) may be a conventional etherifying agent, for example an alcohol such as methanol, ethanol, isopropanol, n-butanol, ethylene glycol, 2-methoxyethanol, or 2-butoxyethanol, an alkylene oxide such as ethylene or propylene oxide, a dialkyl sulphate such as dimethyl sulphate or an alkyl halide such as methyl iodide.

The reaction between the anhydride (E) and either the novolak resin (A) or the reaction product of (A) and the quinone diazide (D) is usually effected in an inert solvent such as a ketone or ether, optionally in the presence of a base or a quaternary ammonium salt as catalyst. The reaction is generally carried out at a temperature of from 40° C. to 150° C. an is usually complete in 2 to 8 hours.

The optional esterification stage using esterifying agent (F) is usually effected in an inert solvent, such as a ketone or ether, at ambient temperature and in the presence of a suitable condensing agent, which may be a strong acid when Z represents a hydroxyl or alkoxy group, or a base when Z represents a halogen atom. The amount of (F) is preferably not more than 0.4 mole per equivalent of phenolic hydroxyl in (A).

The optional etherification stage using (G) may be carried out using conventional methods for the etherification of phenolic resins, preferably using not more than 0.4 mole of (G) per equivalent of phenolic hydroxy in (A).

It will be understood that when the phenolic hydroxyl groups in a novolak resin are partially reacted with one or more esterifying agents, the modified resin will contain, in addition to molecules where some of the aromatic rings have free hydroxyl groups and the other aromatic rings have esterified hydroxyl groups, molecules where all of the aromatic rings have free hydroxyl groups and molecules where all of the aromatic rings have esterified hydroxyl groups. Thus formulae such as formula V representing such resins are statistical representation, allowing $R^2$ to denote hydrogen atoms on some rings, groups $SO_2R^4$ on other rings, groups —$COR^3COOH$ on further rings and groups —$COR^5$ or —$SO_2R^5$ on yet further rings. Similar considerations apply to formula V in so far as it represents resins derived from a mixture of different phenols.

When used as electrodepositable photoresists the resins of the present invention are used in the form of salts thereof which are soluble or dispersible in aqueous, including aqueous organic, media. Thus, if they are prepared in media such that they are present as salts, the media containing these salts can be used directly in the electrodeposition process. If the resins are isolated as acids, before use in the electrodeposition process they are converted into their salts by addition of a suitable base to neutralise, at least partially, the acid groups.

Suitable bases that may be used to form the salt include inorganic bases such as sodium or potassium hydroxide or carbonate and ammonia, and organic bases such as triethylamine, triethanolamine, benzyldimethylamine, dimethylethanolamine and dimethylaminomethylpropanol.

When used as photoresists, the salts of resins of the invention may be coated onto carriers to form photosensitive elements. Suitable carriers include metals such as aluminium and copper, either as a solid metal sheet or as a metal-faced laminate.

The resins of this invention may be used alone or, if desired, in admixture with substances that are soluble or dispersible in aqueous media and that improve the quality of the coating deposited. Typical such substance include acrylic, alkyd, polybutadiene and epoxide resins which are dilutable in aqueous media.

Electrodeposition of the new resins followed known procedures. Voltages of up to 200 volts for periods of up to 5 minutes are generally used, but the precise conditions for particular resins, substrates and desired thicknesses may be readily determined by those skilled in the art of electrodepositing resinous materials.

After electrodeposition the coatings are dried and may then be exposed to actinic radiation, preferably of wavelength 200 to 600 nm, usually through an image-bearing transparency. Development in a suitable aqueous or non-aqueous base leaves a positive image upon the substrate.

Accordingly, the invention also provides a process for the production of an image which comprises applying by electrodeposition a layer comprising a resin of the invention onto a substrate, exposing the electrodeposited layer to actinic radiation in a predetermined pattern and removing exposed areas by contact with a developer.

The following Examples illustrate the invention. All parts and percentages are by weight.

The novolak resins used as starting materials are as follows:

NOVOLAK I

This denotes a resin made from a novolak, prepared from 3 moles of phenol and 1 mole of p-tert.butylphenol and formaldehyde, by further reaction with 1,2-naphthoquinone-2-diazide-5-sulphonyl chloride. The product is of formula V in which $R^1$ represents hydrogen, 88% of the groups $R^2$ represent hydrogen and the remainder represent a 1,2-naphthoquinone-2-diazide-5-sulphonyl group, x denotes zero for 75% of the molecule and x denotes 1 for 25% of the molecule, in which case $R^6$ denotes p-tert.-butyl, and n denotes an integer of average value 7.1.

NOVOLAK II

This denotes a novolak made from phenol, p-tert.-butylphenol, formaldehyde, and oxalic acid in the molar ratio 0.75:0.25:0.90:0.046.

The novolak has a softening point of 119° C. and is of formula V where $R^1$ represents hydrogen,
$R^2$ represents hydrogen,
x denotes zero for 75% of the molecule and
x denotes 1 for 25% of the molecule, in which case $R^6$ denotes -tert.butyl, and
n denotes an integer of average value 7.5.

NOVOLAK III

This denotes a novolak made from a commercial mixture of o-, m- and p-cresols, formaldehyde and oxalic acid in the molar ratio 1:0.75:0.001.

The novolak has a softening point of 120° C. and is of formula V where $R^1$ and $R^2$ represent hydrogen,
x denotes 1,
$R^6$ represents o-, m- and p-methyl, and
n denotes an integer of average value 6.5

NOVOLAK IV

This denotes a novolak made from 1-naphthol, m-cresol, formaldehyde, and oxalic acid in the molar ratio 0.2:0.8:0.9:0.017.

The novolak has a softening point of 148° C. and is of formula V where $R^1$ and $R^2$ represent hydrogen,
x denotes 1 for 80% of the molecule, in which case $R^6$ denotes m-methyl,
x denotes 2 for 20% of the molecule, in which case the two groups $R^6$, in the 2,3 positions with respect to the groups $-OR^2$, together with the carbon atoms to which they are attached, represent an unsubstituted benzo group, and
n denotes an integer of average value 4.8.

NOVOLAK V

This denotes a novolak made from m-cresol, benzaldehyde and HCl in the molar ratio 1.00:1.00:0.005.

The novolak has a softening point of 118° C. and is of formula V where $R^1$ represents phenyl,
$R^2$ represents hydrogen,
x denotes 1,
$R^6$ denotes m-methyl and
n denotes an integer of average value 4.2.

NOVOLAK VI

This denotes a novolak made from bisphenol A and formaldehyde in the molar ratio 1:0.46, using orthophosphoric acid as catalyst.

The novolak has a softening point of 75° C. and is of formula V where $R^1$ and $R^2$ represent hydrogen,
x denotes 1,
$R^6$ represents a group of formula IV where $R^8$ represents an isopropylidene group para to both groups $-OR^2$, and
n denotes an integer of average value 2.4.

EXAMPLE 1

Novolak I (20 g) is dissolved in acetone (50 g) and heated to 50° C. A solution of iso-octenyl succinic anhydride (4.4 g) and a 0.5% solution in water of tetramethylammonium chloride (0.12 g) in acetone (10 g) is added and the mixture heated at 50° C. for 8 hours. The mixture is added dropwise to dilute hydrochloric acid (1000 g—0.1% HCl) which causes precipitation of a brown resinous solid. This is ground to a powder, washed with water, and dried in a vacuum oven at 35° C. to give 17.7g of a product of formula V in which $R^1$ represents hydrogen,
72.5% of the groups $R^2$ represent hydrogen, 12% represent a 1,2-naphthoquinone-2-diazide-5-sulphonyl group and 15.5% represent a group of formula

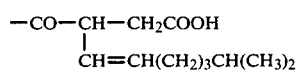

or

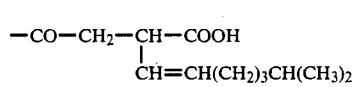

x denotes zero for 75% of the molecule,
x denotes 1 for 25% of the molecule, in which case $R^6$ denotes p-tert.-butyl, and
n denotes an integer of average value 7.1.

The infrared spectrum, measured on a KBr disc, shows absorption maxima at 3400, 2960, 2860, 2160, 2120, 1710, 1660, 1550, 1480, 1440, 1400, 1360, 1260 and 1200 cm$^{-1}$.

This product is added slowly to a mixture of 2-butoxyethanol (4 g) and a 20% solution in water of potassium hydroxide (0.5 g), to obtain a red brown solution which is further diluted with water until it contains 10% of the product. This product is electrodeposited onto a copper-clad laminate anode, using a stainless steel cathode. A deposit 5 micrometers thick forms after 20 seconds at 80 volts. The laminate is withdrawn from the bath, rinsed with water, and dried for 5 minutes at 90° C. It is then irradiated through an image-bearing transparency for 1 minute, using a 500 w medium pressure mercury halide lamp at a distance of 75 cm. Immersion in 0.5% aqueous sodium hydroxide gives a clear positive image of the transparency.

EXAMPLE 2

Novolak I (30 g) is dissolved in acetone (60 g) and heated to reflux (59° C.), A solution of phthalic anhydride (4.4 g), triethylamine (0.17 g) and acetone (10 g) is added and the mixture held at reflux for 2 hours. The mixture is neutralised with a 20% aqueous solution of sodium hydroxide (6 g) and diluted with water (150 g). Addition of this mixture to 1000 cm$^3$ of water containing HCl (6 g) causes the precipitation of a yellow/brown resinous solid. This is washed with water and dried in a vacuum oven at 35° C. to give 30.2 g of a product of formula V in which $R^1$ represents hydrogen,
73% of the groups $R^2$ represent hydrogen, 12% represent a 1,2-naphthoquinone-2-diazide-5-sulphonyl group and 15% represent a group of formula

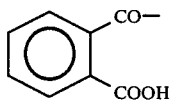 XIII x denotes zero for 75% of the molecule,
x denotes 1 for 25% of the molecule, in which case $R^6$ denotes p-tert.butyl, and
n denotes an integer of average value 7.1.

Its infrared spectrum, measured on a KBr disc, shows absorption maxima at 3400, 2960, 2860, 2160, <120, 1710, 1600, 1510, 1490, 1430, 1400, 1360, 1260, 1190 cm$^{-1}$.

This product can be electrocoated onto a substrate and a positive image formed as described in Example 1.

EXAMPLE 3

Example 2 is repeated, replacing the phthalic anhydride used in that example with glutaric anhydride (2.28 g). A product (19.0 g) is obtained with an infrared spectrum, measured on a KBr disc, showing absorption maxima at 3400, 3250, 2960, 2160, 2120, 1740, 1710, 1610, 1600, 1510, 1490, 1460, 1440, 1400, 1360, 1260, 1200 cm$^{-1}$.

The product is of formula V in which
$R^1$ represents hydrogen,
78% of the groups $R^2$ denote hydrogen, 12% represent a 1,2-naphthoquinone-2-diazide-5-sulphonyl group and 10% represent a group of formula —CO(CH$_2$)$_3$COOH,
x denotes zero for 75% of the molecule,
x denotes 1 for 25% of the molecule, where $R^6$ denotes p-tert.-butyl, and
n denotes an integer of average value 7.1.

The product can be electrocoated onto a substrate and a positive image formed, as described in Example 1.

EXAMPLE 4

Novolak II (25 g) is dissolved in dioxan (50 g) and heated to 100° C. Iso-octenyl succinic anhydride (5.5 g) and tetramethylammonium chloride (0.3 g; 10% aqueous solution) are added and the mixture heated at 100° C. for 6 hours. The mixture is cooled to room temperature and then added dropwise to 0.1% aqueous hydrochloric acid (1000 cm$^3$). The resulting red resinous product is ground up and dried at 90° C. in a vacuum oven.

This product (18 g) is dissolved in acetone (50 g) and a solution of 1,2-naphthoquinone-2-diazide-5-sulphonyl chloride (6 g) in acetone (20 g) is added. The solution is adjusted to pH 8 by addition of 10% aqueous sodium carbonate solution. The mixture is stirred at room temperature for 1 hour and then added dropwise to 0.2N hydrochloric acid solution (2.5 liters).

A yellow resinous precipitate is obtained and this is filtered off, washed with water and dried in a vacuum oven at 35° C. to give a product (17.5 g) which has a similar infrared absorption spectrum to that of the product of Example 1. The product can be electrocoated onto a substrate and a positive image formed as described in Example 1. The product is of formula V where
$R^1$ represents hydrogen
68% of the groups $R^2$ represent hydrogen, 19.5% represent a 1,2-naphthoquinone-2-diazide-5-sulphonyl group and 12.5% represent a group of formula XI or XII,
x denotes zero for 75% of the molecule,
x denotes 1 for 25% of the molecule, when $R^6$ denotes p-tert.butyl, and
n denotes an integer of average value 7.5.

EXAMPLE 5

Novolak II (60 g) is dissolved in dioxan (120 g) and heated to 100° C. Glutaric anhydride (6.84 g) is added and the mixture heated at 100° C. for 6 hours. The mixture is neutralised with 20% aqueous sodium hydroxide (12 g) and diluted with water (400 g) and added dropwise to 0.3N hydrochloric acid solution (1.5 liters). The yellow precipitate which forms is filtered, washed and dried at 90° C. in a vacuum oven.

This product (18 g) is dissolved in acetone (b 50 g) and a solution of 1,2-naphthoquinone-2-diazide-5-sulphonyl chloride (6 g) in acetone (20 g) is added. The solution is adjusted to pH 8 by addition of 10% aqueous sodium carbonate solution. The mixture is stirred at room temperature for 1 hour and then added dropwise to 0.2N HCl (2 liters).

A yellow precipitate is formed which is filtered, washed and dried at 35° C. in a vacuum oven. A product (18 g) is obtained which has an infrared absorption spectrum similar to that obtained for the product of Example 3. It can be electrocoated onto a substrate and a positive image formed as described in Example 1. The product is of formula V where
$R^1$ represents hydrogen,
69.5% of the groups $R^2$ represents hydrogen, 18% represent a 1,2-naphthoquinone-2-diazide-5-sulphonyl group and 12.5% represent a group of formula —CO(CH$_2$)$_3$COOH,
x denotes zero for 75% of the molecule,
x denotes 1 for 25% of the molecule, in which case $R^6$ represents p-tert.butyl, and
n denotes an integer of average value 7.5.

EXAMPLE 6

Example 3 is repeated but using 0.86 g of glutaric anhydride in place of 2.28 g used in that example. The product (24 g) obtained is of formula V in which
$R^1$ represents hydrogen,
84% of the groups $R^2$ denote hydrogen, 12% represent a 1,2-naphthoquinone-2-diazide-5-sulphonyl group and 4% represent a group of formula —CO(CH$_2$)$_3$COOH,
x denotes zero for 75% of the molecule,
x denotes 1 for 25% of the molecule where $R^6$ denotes p.tert.butyl, and
n denotes an integer of average value 7.1.

The product can be electrocoated onto a substrate and a positive image formed, as described in Example 1.

EXAMPLE 7

Novolak III (22.5 g) is dissolved in acetone (50 g) and treated with a solution of 1,2-naphthoquinone-2-diazide-5-sulphonyl chloride (7.5 g) in acetone (30 g). The mixture is adjusted to pH 8 by the addition of a 5% solution in water of sodium carbonate, then stirred at room temperature for 90 minutes. It is poured into 1,500 cm$^3$ of water containing HCl (12 g) and the precipitate is filtered, washed with water and dried in a vacuum oven at 35° C. to give 26 g of a solid.

The solid (10 g) is dissolved in dioxane (20 g) and treated with a solution of glutaric anhydride (1.14 g)

and triethylamine (0.06 g) in dioxane (10 g). The mixture is heated to 60° C. and held at this temperature for 2 hours. The mixture is neutralised with 20% aqueous sodium hydroxide (2 g), diluted with water (50 g) and added dropwise to 0.3N hydrochloric acid (1.5 liters). A yellow precipitate is formed which is filtered, washed with water and dried in a vacuum oven at 35° C. to give 9.3 g of a product of formula V in which $R^1$ represents hydrogen, 69% of the groups $R^2$ represent hydrogen, 15% represent a a group of formula —CO(CH$_2$)$_3$COOH, x denotes 1, $R^6$ represents o-, m- and p-methyl, and n denotes an integer of average value 6.5.

The product can be electrocoated on to a substrate and a positive image formed as described in Example 1.

EXAMPLE 8

Novolak IV (36 g) is dissolved in acetone (80 g) and treated with a solution of 1,2-naphthoquinone-2-diazide-5-sulphonyl chloride (12 g) in acetone (20 g). The mixture is adjusted to pH 8 by addition of 5% aqueous sodium carbonate, then stirred at room temperature for 90 minutes. It is poured into water (2 liters) containing HCl (17 g) and the precipitate is filtered, washed with water and dried in a vacuum oven at 35° C. to give 42.2 g of a solid.

This solid (10 g) is dissolved in acetone (20 g) and heated to reflux (57° C,). A solution of glutaric anhydride (0.43 g), triethylamine (0.06 g) and acetone (10 g) is added and the mixture held at reflux for 2 hours. The mixture is neutralised with a 20% aqueous solution of sodium hydroxide and diluted with water. Addition of this mixture to 1000 cm$^3$ of water containing HCl (5 g) causes the precipitation of a brown resinous solid. This is washed with water and dried in a vacuum oven at 35° C. to give 8 g of product of formula V in which $R^1$ represents hydrogen, 77.6% of the groups $R^2$ denote hydrogen, 16% represent a 1,2-naphthoquinone-2-diazide-5-sulphonyl group and 6.4% represent a group of formula —CO(CH$_2$)$_3$COOH, x denotes 1 for 80% of the molecule, in which case $R^6$ denotes m-methyl, x denotes 2 for 20% of the molecule, in which case the two groups $R^6$, in the 2,3 positions with respect to the groups —OR$^2$, together with the carbon atoms to which they are attached, represent an unsubstituted benzo group, and n denotes an integer of average value 4.8.

The product can be electrocoated onto a substrate and a positive image formed, as described in Example 1.

EXAMPLE 9

Novolak V (36 g) is dissolved in acetone (70 g) and treated with a solution of 1,2-naphthoquinone-2-diazide-5-sulphonyl chloride (12 g) in acetone (30 g). The mixture is adjusted to pH 8 by the addition of 5% aqueous sodium carbonate, then stirred at room temperature for 90 minutes. It is then poured into water (2 liters) containing HCl (17.6 g) and the precipitate filtered, washed with water and dried in a vacuum oven at 35° C. to give 36.8 g of a solid.

This solid (10 g) is dissolved in dioxane (20 g) containing triethylamine (0.06 g) and heated to 60° C. A solution of glutaric anhydride (1.14 g) in dioxane (20 g) is added and then the mixture held at 60° C. for 3 hours. The mixture is neutralised with a 20% aqueous solution of sodium hydroxide (2 g) and diluted with water (50 g). Addition of this mixture to 500 cm$^3$ of water containing HCl (2 g) causes the precipitation of a yellow resinous solid. This is washed with water and dried in a vacuum oven at 35° C. to give 8.7 g of a product of formula V in which $R^1$ represents phenyl, 50% of the groups $R^2$ represent hydrogen, 25% represent a 1,2-naphthoquinone-2-diazide-5-sulphonyl group and 25% represent a group of formula —CO(CH$_2$)$_3$COOH, x denotes 1, $R^6$ represents m-methyl, and n denotes an integer of average value 4.2.

This product can be electrocoated onto a substrate and a positive image formed as described in Example 1.

EXAMPLE 10

Novolak VI (60 g) is dissolved in acetone (120 g) and is treated with a solution of 1,2-naphthoquinone-2-diazide-5-sulphonyl chloride (20 g) in acetone (30 g). The mixture is adjusted to pH 8 by the addition of 5% aqueous sodium carbonate, then stirred at room temperature for 90 minutes. It is then poured into water (3 liters) containing HCl (29 g) and the precipitate filtered, washed with water and dried in a vacuum oven at 35° C. to give 62.3 g of a solid.

This solid (10 g) is dissolved in dioxane (20 g) containing triethylamine (0.06 g) and heated to 60° C. A solution of glutaric anhydride (1.14 g) in dioxane (20 g) is added and the mixture held at 60° C. for 2 hours. The mixture is neutralised with a 20% aqueous solution of sodium hydroxide (2 g) and diluted with water (50 g). Addition of this mixture to 500 cm$^3$ of water containing HCl (2 g) causes the precipitation of a red/brown resinous solid. This is washed with water and dried in a vacuum oven at 35° C. to give 8.7 of a product of formula V in which $R^1$ represents hydrogen, 69% of the groups $R^2$ represent hydrogen, 15% represent a 1,2-naphthoquinone-2-diazide-5-sulphonyl group and 16% represent a group of formula —CO(CH$_2$)$_3$COOH, $R^6$ represents a group of formula IV where $R^8$ represents an isopropylidene group para to both groups OR$^2$, x denotes 1, and n denotes an integer of average value 2.4.

This product can be electrocoated onto a substrate and a positive image formed as described in Example 1.

What is claimed is:

1. An electrodepositable photosensitive modified phenolic novolak resin of general formula

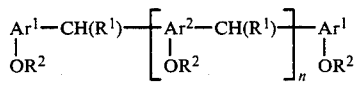

where

Ar$^1$ represents a divalent aromatic group linked through aromatic carbon atoms to the indicated groups —OR$^2$ and —CH(R$^1$)—, Ar$^2$ represents a trivalent aromatic group linked through aromatic carbon atoms to the indicated groups —OR$^2$ and —CH(R$^1$)—, $R^1$ represents a hydrogen atom or an alkyl, aryl or carboxyl group, $R^2$ represents a hydrogen atom, an alkyl group, an alkyl group substituted by a hydroxyl or alkoxy group, or a group of formula $-CO-R^3-COOH$, $-SO_2R^4$, $-COR^5$ or $-SO_2R^5$, at least 1% of the groups $R^2$ representing a group $-CO-R^3-COOH$ and at least 4% of the groups $R^2$ representing a group $-SO_2R^4$, $R^3$ denotes a divalent aliphatic, cycloaliphatic, aromatic or araliphatic group, $R^4$ denotes a 1,2-benzoquinone diazide group or 1,2-naphthoquinone diazide group of formula

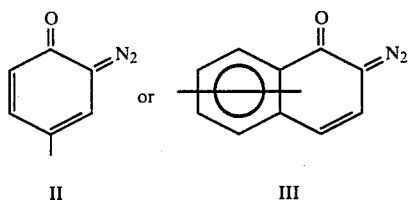

II          III the free valency bond of formula III being in the 4- or 5-position, $R^5$ represents a carboxyl-free monovalent aliphatic, cycloaliphatic, aromatic or araliphatic group, and n denotes zero or an integer of 1 to 20.

2. A resin according to claim 1, in which the groups $Ar^1$ and $Ar^2$ have from 6 to 25 carbon atoms and are unsubstituted or have at least one substituent $R^6$ on an aromatic carbon atom, where $R^6$ represents a halogen atom; a group of formula $-OR^2$; a carboxyl or sulfonic acid group; an esterified carboxyl or sulfonic acid group; an alkyl, alkenyl or aryl group; an alkyl, alkenyl or aryl group substituted by a hydroxyl or carboxyl group; a group of formula $-COR^7$ where $R^7$ represents an alkyl, cycloalkyl or aryl group; or one group $R^6$ on each aromatic ring represents a group of formula

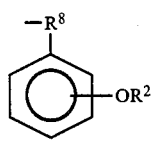

IV which may be connected to adjacent aromatic rings through groups $-CH(R^1)-$, where $R^8$ represents an oxygen or sulfur atom; a carbonyl or sulfonyl group; a $C_1$ to $C_8$ alkylene group; or a $C_1$ to $C_8$ alkylene group substituted by a halogen atom, a hydroxyl group, an etherified hydroxyl group, a carboxyl group, an esterified carboxyl group, a $C_6$-$C_{12}$ aryl group or a $C_6$ to $C_{12}$ aryl group substituted by a halogen atom, a hydroxyl group, an etherified hydroxyl group, a carboxyl group or an esterified carboxyl group or, when there are two substituents $R^6$ on adjacent carbon atoms, the two substituents $R^6$, together with the carbon atoms to which they are attached, represent a benzo group.

3. A resin according to claim 2, which is of general formula

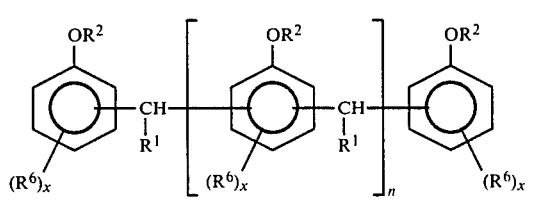

where n denotes zero or an integer of 1 to 20, x denotes zero, 1, 2 or 3, $R^1$ represents a hydrogen atom or an alkyl, aryl or carboxyl group, $R^2$ represents a hydrogen atom, an alkyl group, an alkyl group substituted by a hydroxyl or alkoxy group, or a group of formula $-CO-R^3-COOH$, $-SO_2R^4$, $-COR^5$ or $-SO_2R^5$, at least 1% of the groups $R^2$ representing a group $-CO-R^3-COOH$ and at least 4% of the groups $R^2$ representing a group $-SO_2R^4$, $R^3$ denotes a divalent aliphatic, cycloaliphatic, aromatic or araliphatic group, $R^4$ denotes a 1,2-benzoquinone diazide group or 1,2-naphthoquinone diazide group of formula

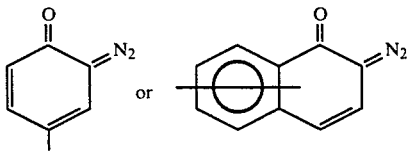

II          III the free valency bond of formula III being in the 4- or 5-position, $R^5$ represents a carboxyl-free monovalent aliphatic, cycloaliphatic, aromatic or araliphatic group, and $R^6$ is as defined in claim 2.

4. A resin according to claim 3, in which 8 to 75% of the groups $R^2$ represent a group of formula $-SO_2R^4$ and 2 to 50% of the groups $R^2$ represent a group of formula $-CO-R^3-COOH$.

5. A resin according to claim 3, in which 10 to 50% of the groups $R^2$ represent a group of formula $-SO_2R^4$ and 4 to 30% of the groups $R^2$ represent a group of formula $-CO-R^3-COOH$.

6. A resin according to claim 3, in which alkyl, alkoxy and alkenyl groups within the definitions of $R^1$, $R^2$, $R^6$ and $R^7$ have up to 20 carbon atoms, aryl and aralkyl groups within the definitions of $R^1$, $R^6$ and $R^7$ have up to 20 carbon atoms, and monovalent groups within the definition of $R^5$ and divalent groups within the definition of $R^3$ have up to 25 carbon atoms.

7. A resin according to claim 3, in which $R^1$ represents a hydrogen atom or a methyl, ethyl, phenyl or carboxyl group.

8. A resin according to claim 3, in which $R^3$ represents a divalentt hydrocarbyl group or a divalent hydrocarbyl group substituted by one or more halogen atoms, alkoxy groups having 1 to 4 carbon atoms, carboxyl groups or esterified carboxyl groups.

9. A resin according to claim 8, in which $R^3$ is a residue of an aliphatic, cycloaliphatic or aromatic polycarboxylic acid, having from 4 to 20 carbon atoms, after removal of two carboxyl groups.

10. A resin according to claim 3, in which
x denotes zero, or
x denotes 1 and the groups $R^6$ represent the same or different alkyl group having 1 to 9 carbon atoms, or a group of formula IV where $R^8$ represents a methylene or isopropylidene group, or
x denotes zero for part of the indicated aromatic rings and denotes 1 for the remainder, the groups $R^6$ representing the same or different alkyl group of 1 to 9 carbon atoms or
x denotes 1 for part of the indicated aromatic rings, the groups $R^6$ representing the same or different alkyl group of 1 to 9 carbon atoms, and denotes 2 for the remaining rings, the two groups $R^6$ being in the 2,3-positions with respect to the indicated groups —$OR^2$ and the groups $R^6$, together with the carbon atoms to which they are attached, representing an unsubstituted benzo group.

11. A resin according to claim 10, in which the alkyl groups are o-, m-, or p-methyl, o-, m-, or p-tert.butyl or o-, m-, or p-octyl groups, the positions being relative to the groups —$OR^2$.

12. A resin according to claim 3, in the form of a salt which is soluble or dispersible in an aqueous medium.

13. A process for the preparation of electrodepositable photosensitive modified phenolic novolak resins which comprises reacting
(A) a phenolic novolak resin having phenolic hydroxyl groups, prepared from a phenol (B) and an aldehyde (C), with
(D) a quinone diazide sulfonic acid or reactive derivative thereof to convert at least 4% of the phenolic hydroxyl groups to quinone diazide sulphonyloxy groups, at least one of (A), (B) and the reaction product of (A) and (D) being further reacted with
(E) a polycarboxylic acid anhydride of formula

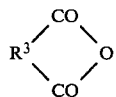
VI where $R^3$ denotes a divalent aliphatic, cycloaliphatic, aromatic or araliphatic group, thereby esterifying at least 1% of the phenolic hydroxyl groups, whereby an electrodepositable photosensitive modified phenolic novolak resin is obtained.

14. A process according to claim 13, in which (A) is reacted with (D) and the resulting product is reacted with (E), or (A) is reacted with (E) and the resulting product is reacted with (D).

15. A process according to claim 13, in which the phenol (B) is of formula

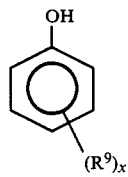
VII the aldehyde (C) is of formula $R^1CHO$ and
the quinone diazide (D) is of formula $R^4SO_2Z$, where
$R^1$ represents a hydrogen atom or an alkyl, aryl or carboxyl group, $R^4$ denotes a 1,2-benzoquinone diazide group or 1,2-naphthoquinone diazide group of formula

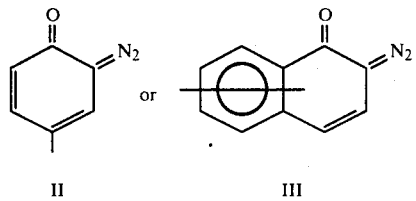

II   III the free valency bond of formula III being in the 4- or 5-position,
$R^9$ represents a halogen atom; a group of formula —$OR^2$; a carboxyl or sulfonic acid group; an esterified carboxyl or sulfonic acid group; an alkyl, alkenyl or aryl group, an alkyl, alkenyl or aryl group substituted by a hydroxyl or carboxyl group; a group of formula —$COR^7$ where $R^7$ represents an alkyl, cycloalkyl or aryl group; or one group $R^6$ on each aromatic ring represents a group of formula

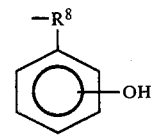
VIII where $R^8$ represents an oxygen or sulfur atom; a carbonyl or sulfonyl group: a $C_1$–$C_8$ alkylene group; or a $C_1$ to $C_8$ alkylene group substituted by a halogen atom, a hydroxyl group, an etherified hydroxyl group, a carboxyl group, an esterified carboxyl group, a $C_6$–$C_{12}$ aryl group or a $C_6$ to $C_{12}$ aryl group substituted by a halogen atom, a hydroxyl group, an etherified hydroxyl group, a carboxyl group or an esterified carboxyl group or,
when there are two substituents $R^9$ on adjacent carbon atoms, the two substituents $R^9$, together with the carbon atoms to which they are attached, represent a benzo group,
Z represents a hydroxyl or alkoxy group or a halogen atom, and
x denotes zero, 1, 2 or 3.

16. A process according to claim 15, in which the phenol (B) is phenol, o-, m- or p-cresol, o-, m- or p-tert.-butylphenol, o-, m- or p-octylphenol, 1-naphthol, 2,2-bis(4-hydroxyphenyl)propane or a mixture of two or more thereof, and the aldehyde (C) is formaldehyde or benzaldehyde.

17. A process according to claim 15, in which (D) is 1,2-naphthoquinone-2-diazide-4- or 5-sulphonyl chloride, and the anhydride (E) is an anhydride of
(a) a saturated or unsaturated aliphatic dicarboxylic acid having 4 to 18 carbon atoms and having the two carboxyl groups separated by a chain of 2 or 3 carbon atoms, or
(b) a cycloaliphatic dicarboxylic acid having from 5 to 20 carbon atoms, or
(c) an aromatic polycarboxylic acid having from 8 to 18 carbon atoms.

18. A process according to claim 15, in which the amount of (D) is from 0.04 to 0.75 mole per equivalent of phenolic hydroxyl group in (A), and the amount of (E) is from 0.02 to 0.5 mole per equivalent of phenolic hydroxyl group in (A).

19. A process according to claim 15, in which the reaction between (E) and (A), or between (E) and the reaction product of (A) and (D), is effected in an inert solvent at a temperature of from 40° to 150° C.

20. An image produced by electrodepositing a layer comprising a resin according to claim 1 onto a substrate, exposing the electrodeposited layer to actinic radiation in a predetermined pattern and removing exposed areas by contact with a developer.

* * * * *